(12) United States Patent
Kainuma et al.

(10) Patent No.: US 7,503,023 B1
(45) Date of Patent: Mar. 10, 2009

(54) EFFICIENT METHOD FOR LOCATING A SHORT CIRCUIT

(75) Inventors: Sean T. Kainuma, Johnson City, NY (US); Michael K. Kerr, Johnson City, NY (US); Raymond H. Kim, Endicott, NY (US); Joseph H. Underwood, Apalachin, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/112,529

(22) Filed: Apr. 30, 2008

(51) Int. Cl.
*G06F 17/50* (2006.01)
(52) U.S. Cl. .............................. 716/4; 716/5
(58) Field of Classification Search .............. 716/1, 716/4, 5, 8, 9, 12, 20
See application file for complete search history.

(56) References Cited

U.S. PATENT DOCUMENTS 7,240,312 B2    7/2007    Dang et al.

OTHER PUBLICATIONS

Su et al., "A Space_Efficent Short-Finding Algorithm", Aug. 1994,IEEE Transactions on Computer-Aided Design of Integrated Circuit and Systems, vol. 13, No. 8, pp. 1065-1068.*

* cited by examiner

*Primary Examiner*—Sun J Lin
(74) *Attorney, Agent, or Firm*—Cantor Colburn LLP

(57) ABSTRACT

A method of locating a short circuit of a shorted circuit path in a circuit layout includes receiving a connecting stack of the circuit layout, receiving the circuit layout defining the connecting stack, receiving at least four virtual probe locations, identifying shortest paths between the at least four virtual probes, and outputting an intersection of the shortest paths, the intersection including the location of the short circuit. According to the method, the connecting stack includes interconnecting paths representing conductive traces of a circuit design, the at least four virtual probe locations exist on the interconnecting stack on at least two different nodes along the shorted circuit path, and the shortest paths are identified between pairs of the at least four probes and are between the at least two different nodes.

1 Claim, 7 Drawing Sheets

EFFICIENT METHOD FOR LOCATING A SHORT CIRCUIT

TRADEMARKS

IBM® is a registered trademark of International Business Machines Corporation, Armonk, N.Y., U.S.A. Other names used herein may be registered trademarks, trademarks or product names of International Business Machines Corporation or other companies.

BACKGROUND

1. Technical Field

This invention generally relates to layout versus schematic (LVS) verification error locating. More particularly, this invention relates to an efficient method for locating short circuits of shorted circuit paths in circuit layouts.

2. Description of Background

Generally, a successful Design rule check (DRC) ensures that a circuit layout conforms to the rules designed/required based on user specific manufacturing techniques. However, DRCs do not verify that any particular circuit layout coincides with a particular circuit design. Layout versus schematic (LVS) verification does however perform comparisons between a desired circuit design (e.g., nodes and connections) and a desired circuit layout (e.g., NFET layers, metal layers, vias, etc).

In some circumstances, a LVS check returns one or more "short circuit" errors. It is appreciated that a simple error does not pin-point a location of a short circuit. Furthermore, it is exceedingly difficult to locate a short circuit in a circuit layout, particularly as a layout design becomes large (e.g., in an ALU design or any other large circuit layout).

SUMMARY

A method of locating a short circuit of a shorted circuit path in a circuit layout includes receiving a connecting stack of the circuit layout, receiving the circuit layout defining the connecting stack, receiving at least four virtual probe locations, identifying shortest paths between the at least four virtual probes, and outputting an intersection of the shortest paths, the intersection including the location of the short circuit. According to the method, the connecting stack includes interconnecting paths representing conductive traces of a circuit design, the at least four virtual probe locations exist on the interconnecting stack on at least two different nodes along the shorted circuit path, and the shortest paths are identified between pairs of the at least four probes and are between the at least two different nodes.

Additional features and advantages are realized through the techniques of the exemplary embodiments described herein. Other embodiments and aspects of the invention are described in detail herein and are considered a part of the claimed invention. For a better understanding of the invention with advantages and features, refer to the detailed description and to the drawings.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

The detailed description explains an exemplary embodiment, together with advantages and features, by way of example with reference to the drawings.

DETAILED DESCRIPTION

According to an exemplary embodiment, a method is provided which significantly increases the simplicity of locating a short circuit within a circuit layout. This increase in simplicity reduces the time in which a short circuit may be found, thereby decreasing the complexity of layout versus schematic verification.

According to an exemplary embodiment, a method of locating a short circuit of a shorted circuit path may be performed by computer. The computer may display a physical layout of the circuit with the shorted circuit path. A 3-dimensional maze (which is actually the metal stack of the circuit containing the short) may be solved to find the shortest path through the maze from a defined point located on the first node of the shorted circuit path to a second defined point located on the second node of the shorted circuit path. The computer may visually fill in this path through the layout on the display with a unique color. It will then solve the maze again from defined points chosen to be located at a different location (within the layout) from the first two points that were used. The computer will then fill in this second path through the layout with another unique color. The very limited area or point where the colors intersect is the location of the actual short circuit.

Figure 1:
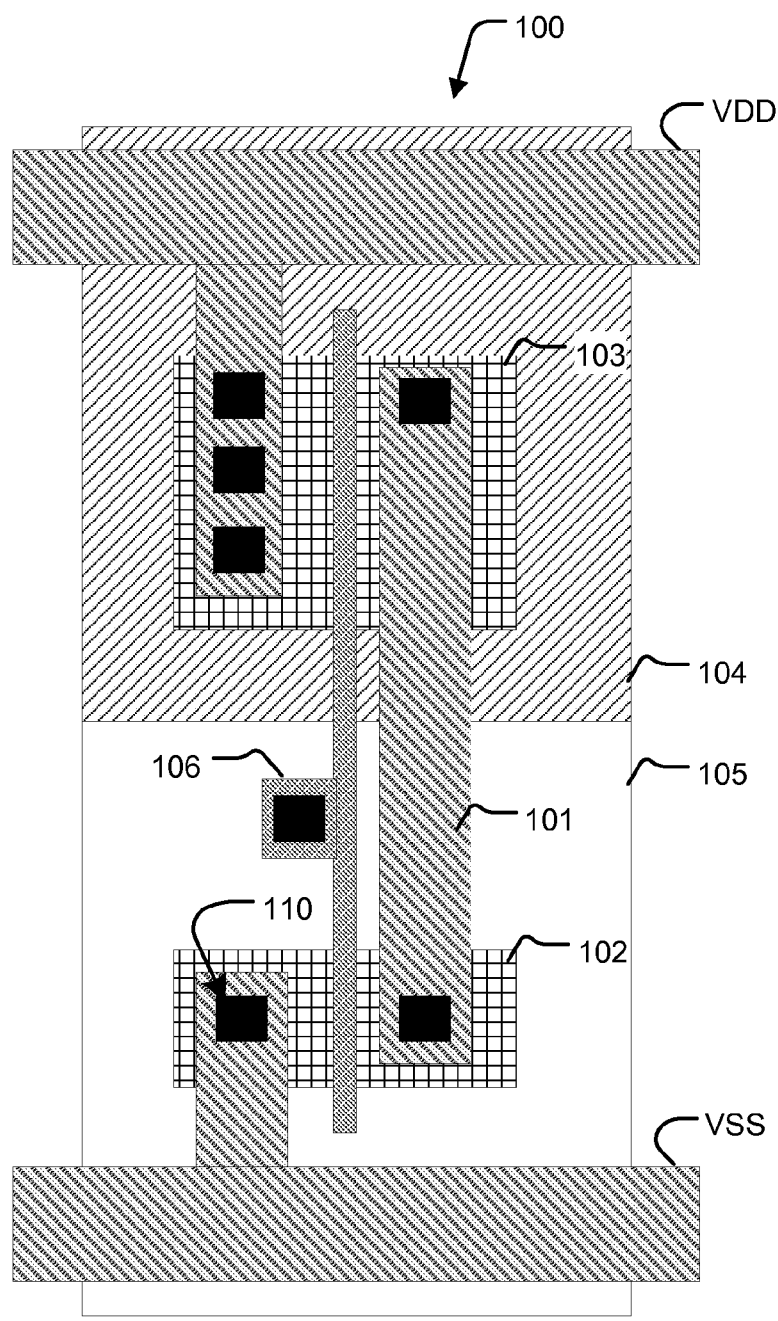
FIG. 1 illustrates a portion of an example circuit layout.

Turning to FIG. 1, a portion of an example circuit layout is illustrated. Generally, design tools may be used to graphically place different portions of an integrated circuit. The different portions may include a plurality of layers representing different parts of a semiconductor chip to contain the circuit, for example, n-doped wells, p-doped wells, conductive traces, poly-silicon traces, etc. The example portion is provided for illustrative purposes only, to aid in understanding the complexity of circuit layouts.

As illustrated, the example inverter circuit 100 includes doped regions 104 and 105. Each of the regions 104 and 105 include doped wells 103 and 102, respectively. Running on the layer directly above the regions 104 and 105 are metallic traces denoted VDD and VSS. Each trace VDD and VSS are considered supply rails to provide voltage to the inverter 100. The inverter 100 further includes poly-silicon trace 106 running directly above the doped wells 103 and 102. The poly-silicon trace 106 acts as an input that, depending upon an applied voltage, causes a change in the conductivity of the doped wells 103 and 102, thereby causing a change in the conductive trace 101. Each of the traces and regions of the semiconductor chip may be connected with vias 110, which are denoted with solid black boxes in FIG. 1. Although the inverter 100 appears at first to look simplistic, it follows that as the number of logic gates and circuit portions increases, the complexity of the circuit layout increases dramatically.

If a layout versus schematic (LVS) algorithm is used to verify the connections of a circuit layout (e.g., FIG. 1) with a respective schematic (e.g., conductive traces of different layers), the LVS algorithm verifies whether conductive traces of the layout are connected similarly to the connections of a circuit schematic. However, if an error occurs, such as a shorted circuit error, the LVS algorithm may only return an error denoting the connections (e.g., VDD or VSS) which are shorted. The algorithm itself may not return any other detailed information regarding the location of the short. It further follows that as the number of logic gates and circuit portions increases, locating the shorted circuit becomes exceedingly difficult.

Figure 2:
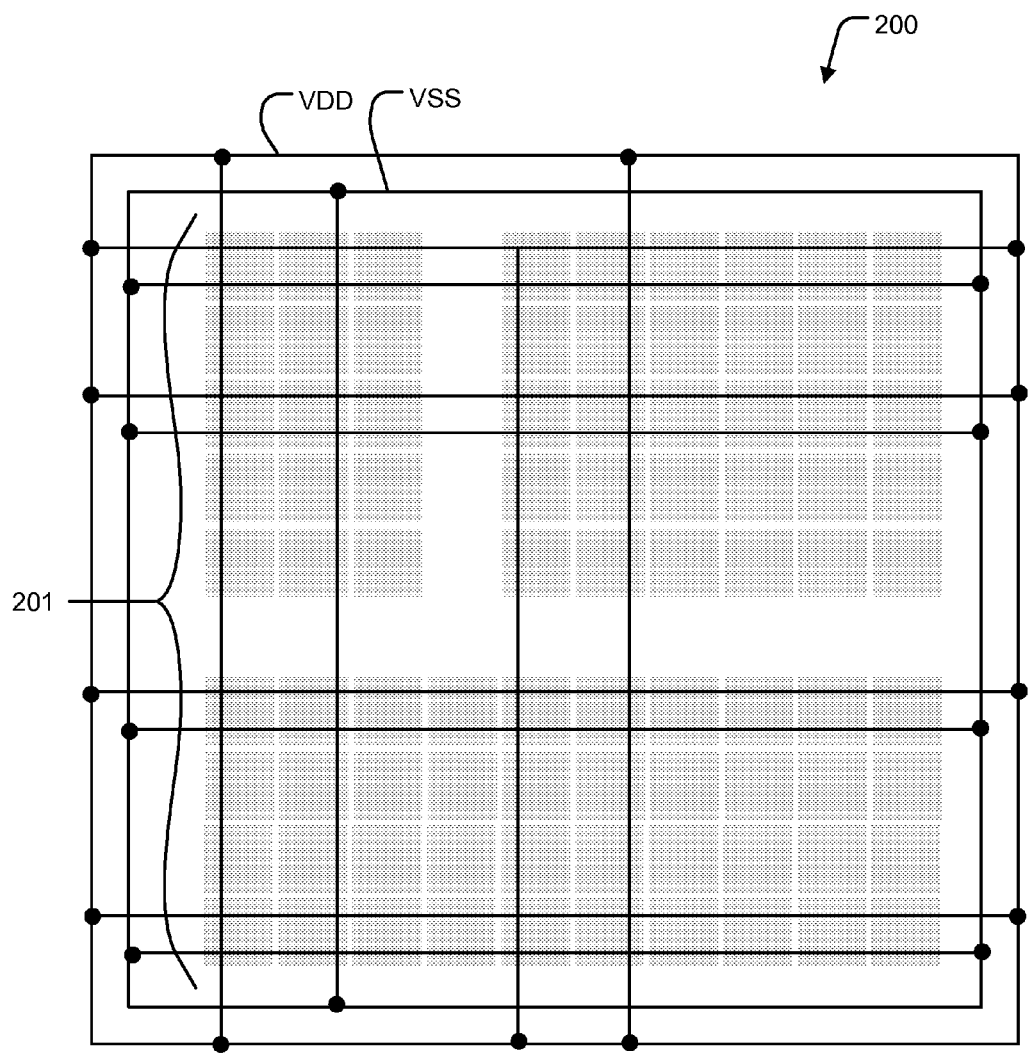
FIG. 2 illustrates an example circuit layout, according to an example embodiment.

Turning to FIG. 2, a circuit layout is illustrated according to an example embodiment. The circuit layout 200 includes supply rails VDD and VSS. The circuit layout further includes circuitry 201. The circuitry 201 may include a plurality of squares. Each square may include a plurality of circuit components such as, for example, logic gates, logic circuitry (e.g., adders, flip-flops, etc), or other circuitry. It is noted that circuitry 201 is illustrated as a plurality of squares for simplicity only. The complex circuitry represented by the square would be difficult to accurately represent in a typical drawing, and is beyond the scope of this disclosure. Thus exhaustive description of the underlying circuitry will be omitted herein for the sake of brevity. Hereinafter, a method of locating a shorted circuit path will be described with reference to FIGS. 3-4.

Figure 3:
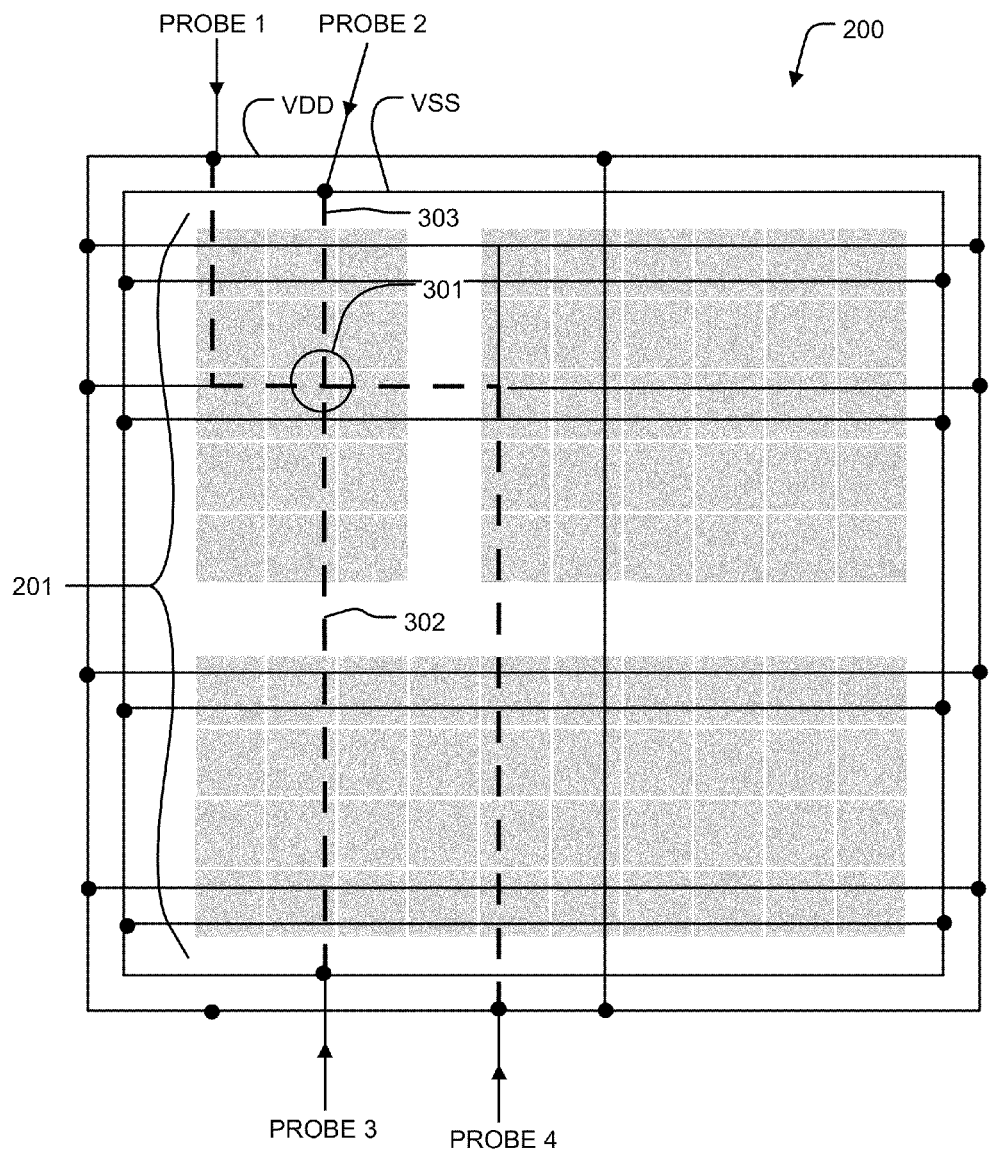
FIG. 3 illustrates an example circuit layout, according to an example embodiment.

Turning to FIG. 3, the circuit layout 200 is illustrated, with overlapping circuit paths identified according to example embodiments. For example, if a LVS algorithm is executed comparing the layout 200 with a representative schematic (not illustrated), the LVS algorithm may return an error. As an example only, and not to be construed as limiting, the error may include a shorted circuit path identified between the supply rails VDD and VSS. As illustrated in FIG. 3, the VDD and VSS supply rails supply different portions of the layout 200, and thus, there may be any plurality of locations with a shorted circuit there-between. According to example embodiments, the layout 200 may be input in a locating algorithm, to aid in locating the short circuit.

Initially, the connecting stack (or metal stack) may be received. This stack may describe the vertical stack of the various horizontal layers of the layout and describe the adjacent connectable layers which, in turn, describe the vertical profile of a 3-dimensional maze to solve. More clearly, as there may be a plurality of layers, each with conductive traces, the layout 200 represents a three-dimensional layout, with different layer stacked upon one another.

The circuit layout 200, which contains the shorted circuit between a node named "VDD" and another node named "VSS" (i.e., supply rails), is also received. Thus, all information necessary to describe a three-dimensional maze is received. Somewhere in that physical layout is the short circuit, but there may be thousands of connections and possible places for the shorted circuit to occur.

According to the example embodiment, two virtual probes may be inserted into the image at node "VDD" and at node "VSS" in the upper left region of the layout 200. The virtual process "probe 1" and "probe 2" may be placed using a circuit layout display program on a computer apparatus. The layout 200 may be displayed in a user interface of the display program, and may provide the virtual probes as an option for locating the shorted circuit path.

The software (i.e., display program) may use an algorithm to find and display the shortest path in the 3-D maze of wiring between probe 1 and probe 2. The shortest path is shown in FIG. 3 as a long-dashed line 303 along the VDD and VSS wiring of layout 200. It is noted that normally there should not be a path between "VDD" and "VSS". However, for the purposes of this example, a shorted circuit path error is presumed between node "VDD" and "VSS".

Because a path exists between probe 1 and probe 2 in this example, the shorted circuit path exits along the displayed shortest path. To further analyze the location of the shorted circuit path, a second set of virtual probes may be placed on the other side of the layout relative to the first set of probes probe 1 and probe 2. These probes, probe 3 and probe 4 are analyzed to determine the shortest path between them. The shortest path is displayed in layout 200 as the short-dashed line 302 along the wiring VDD and VSS.

The area 301 where the two paths intersect is the point where the shorted circuit exists. More clearly, as there is a shorted circuit path between VDD and VSS, and the two shortest paths between VDD and VSS intersect at area 301, the point(s) at which the nodes VSS and VDD short exist in the area 301. The shorted circuit location(s) may be searched for within the area 301, or more specifically, at the point within area 301 where paths 302 and 303 intersect. Thus, as the search area for the shorted circuit has been limited to a point where two paths intersect, the shorted circuit point may be located much faster compared to a search of the entire layout 200.

If more than one short circuit exists between the two nodes ("VDD" and "VSS") then it is possible that these first two paths would not intersect. In that case, the probes may be applied again and again until an intersection is found in the shortest paths that are solved through the maze. The methodology may be iteratively repeated until all shorted points in the layout 200 are located and eliminated. Thus, according to example embodiments, a method of locating a short circuit of a shorted circuit path is provided.

Figure 4:
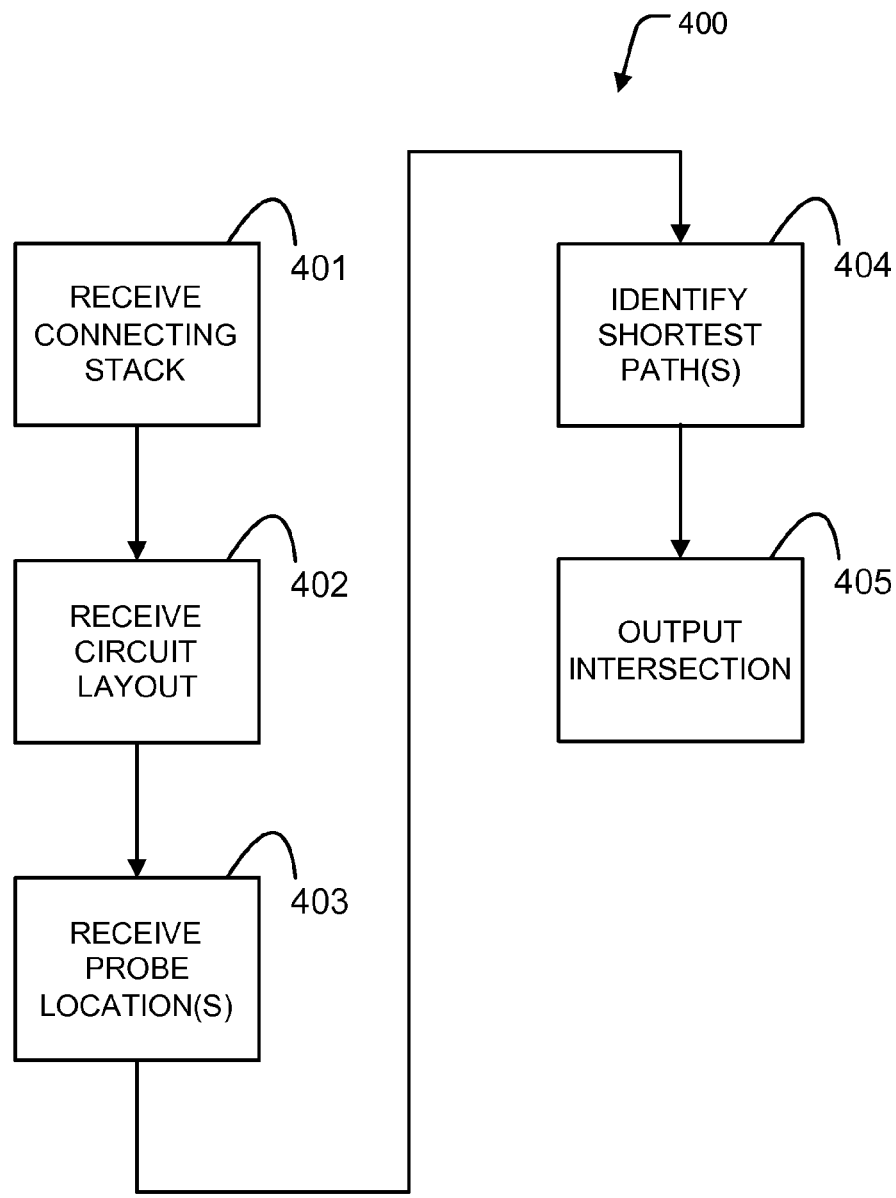
FIG. 4 illustrates a flowchart of a method of locating a short circuit of a shorted circuit path, according to an example embodiment.

Turning to FIG. 4, a method of locating a short circuit of a shorted circuit path is presented as a flowchart. The method 400 may be executed automatically through a computer apparatus, or may be facilitated through user interaction with virtual probes as described below. The method 400 includes receiving a connecting stack at block 401. The connecting stack may include the connections (e.g., metallic or circuit interconnects) of a circuit layout as described with reference to FIG. 3. The method further includes receiving a circuit layout at block 402. The circuit layout received may include a circuit layout from a circuit layout display program as described hereinbefore.

Figure 5A:
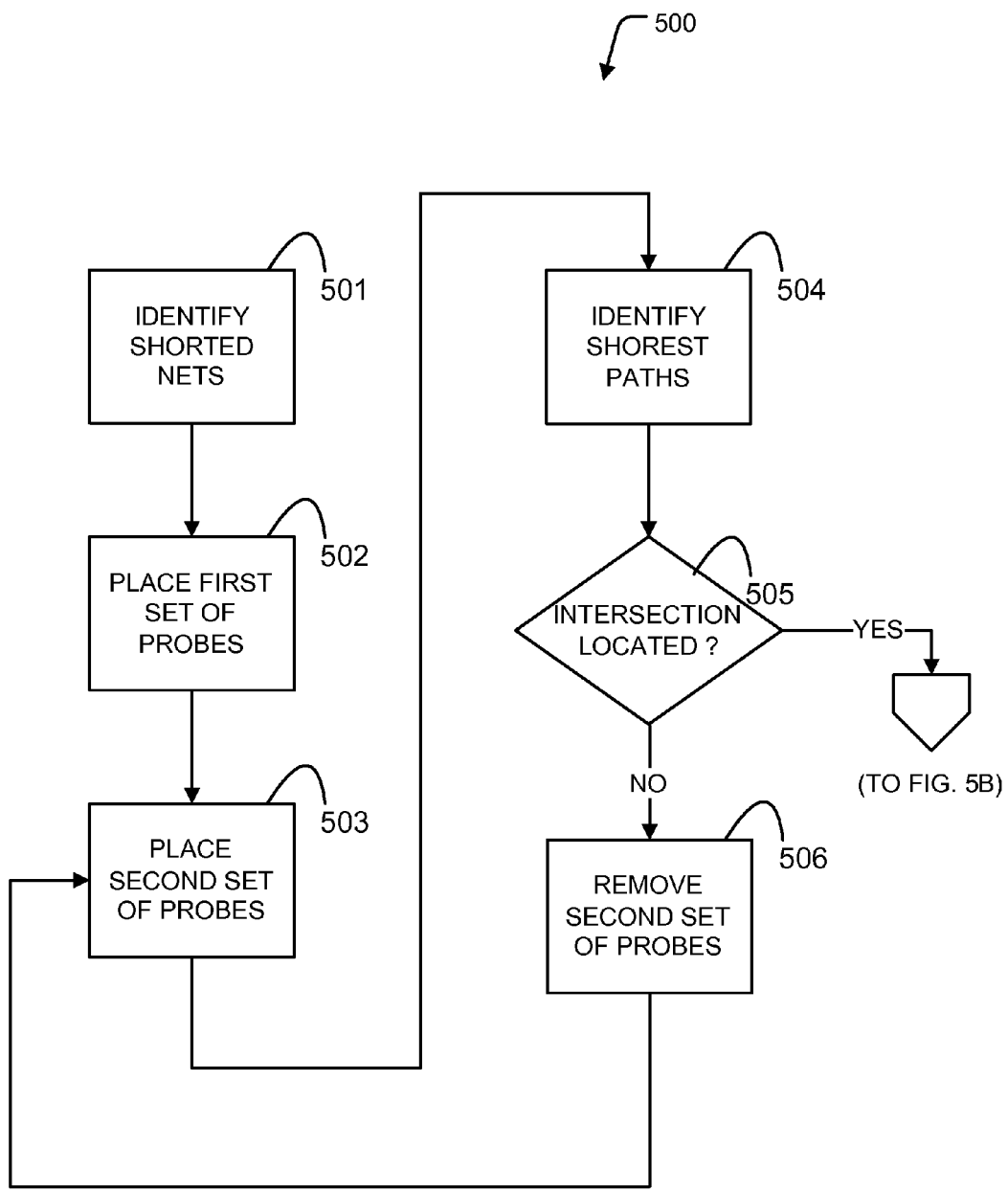
FIGS. 5A and 5B illustrate a flowchart of a method of locating a short circuit of a shorted circuit path, according to an example embodiment.
Figure 5B:
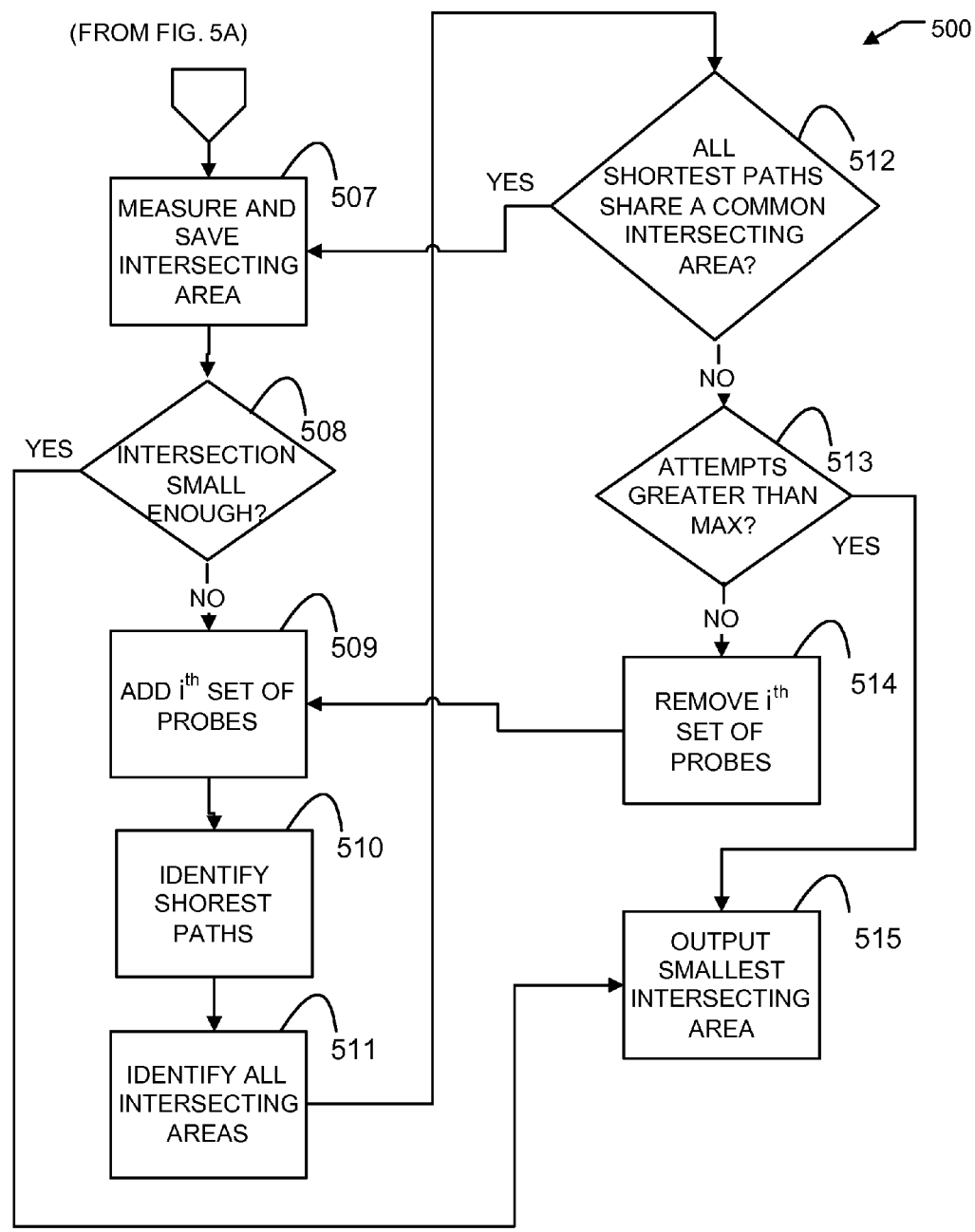

The method 400 further includes receiving virtual probe locations at block 403. For example, a set of virtual probes may be placed in a display program along nodes identified as containing a shorted circuit. Each set of probes may be received individually, as a pair, or altogether. Alternatively, a set of probes may be placed automatically by a computer apparatus based on the identified shorted nets. Thereafter, the method 400 includes identifying the shortest path(s) between the probes at block 404. The shortest paths are identified between sets of two probes received at block 403. The paths may be displayed on the display program such that a user (i.e., circuit designer) may identify them relatively easily. For example, in a typical display program, different stacks of metal interconnects are displayed in different colors according to a standard set of colors for a particular metal layer. The shortest paths may be drawn in a different color to aid them in being identified. Alternatively, the shorted paths may be displayed as dashed, dotted, or other visually different lines. Thereafter, the intersection of the shortest paths is identified at block 405. The intersection of the shortest paths includes at least one short circuit, and may provide a more definite location of the point at which the shorted circuit path's short occurs. If the layout includes more than one shorted circuit path, or if the shorted circuit path includes more than one point or short, the method may be iteratively repeated until all points or shorts are identified. FIGS. 5A and 5B illustrate an example method (similar to method 400 including additional iterations to locate more than one short if more than one exists and to minimize the area that must be manually reviewed to find the short circuit(s)) which may be automatically executed by a computer apparatus upon receipt of a shorted net error from a LVS algorithm.

Turning to FIG. 5A, the method 500 includes identifying shorted net names at block 501. For example, the shorted net names may be provided by the LVS algorithm. The method 500 further includes placing a first set of probes at points on the identified nets at block 502. The probes may be similar to the virtual probes described above (e.g., two probes placed, one on each of the two shorted nets). Thereafter, the method 500 includes placing a second set of probes at block 503. Upon placement of the probes, the shortest paths between the pairs of probes (e.g., first set's path and second set's path) are identified at block 504. If an intersection exists between the shortest paths of the two sets of probes (505), the method may attempt to iterate through different probe placements to identify a least common intersection area for the two paths (see off-page reference to FIG. 5B). If no intersection is identified, the method 500 may include removing the second set of probes at block 506, and re-placing the second set of probes at a different location on the shorted nets at block 503. In this manner, the method 500 iterates to locate an intersection.

Turning to FIG. 5B, if an intersection is identified at block 505, the method 500 includes measuring and storing an intersection area (i.e., common area) at block 507. If the common area is determined to be less than a desired or pre-determined size (see 508), this "least" common or intersection area is output at block 515. Otherwise, the method 500 includes adding an $i^{th}$ set of probes at block 509. For example, "i" may represent any number of the sets of probes placed at block 509. Following placement, the shortest path for each probe set is identified at block 510 and all common intersecting areas are identified at block 511. If it is determined that all shortest paths (from block 510) share a common intersecting area between the shorted nets (see 512), then the intersecting area is stored at block 507 and the method continues at block 508 as "i" is incremented. If it is determined that all shortest paths (from block 510) do not share a common intersecting area between the shorted nets (see 512), and if a maximum number of iterations/attempts has not been exhausted (see 513), the $i^{th}$ set of probes is removed (see 514) and replaced at a new location at block 509 and the method continues as described previously. If the desired or predetermined maximum number of attempts has been exhausted, the smallest stored area is output at block 515. It is noted that the smallest common area denotes the area of the circuit layout containing at least one short. It is further noted that the "maximum" number of attempts described above may be any number. It is an infinite loop except for that which limits iterations and replacement of probes indefinitely.

Through the methods 400 and 500 including the "two loop intersection" methodology presented graphically above, a circuit designer may be presented with the smallest possible area in which to more definitively search for the short between the nets. Example embodiments may thus reduce the length of time required for a designer to find a short between electrical nets.

Figure 6:
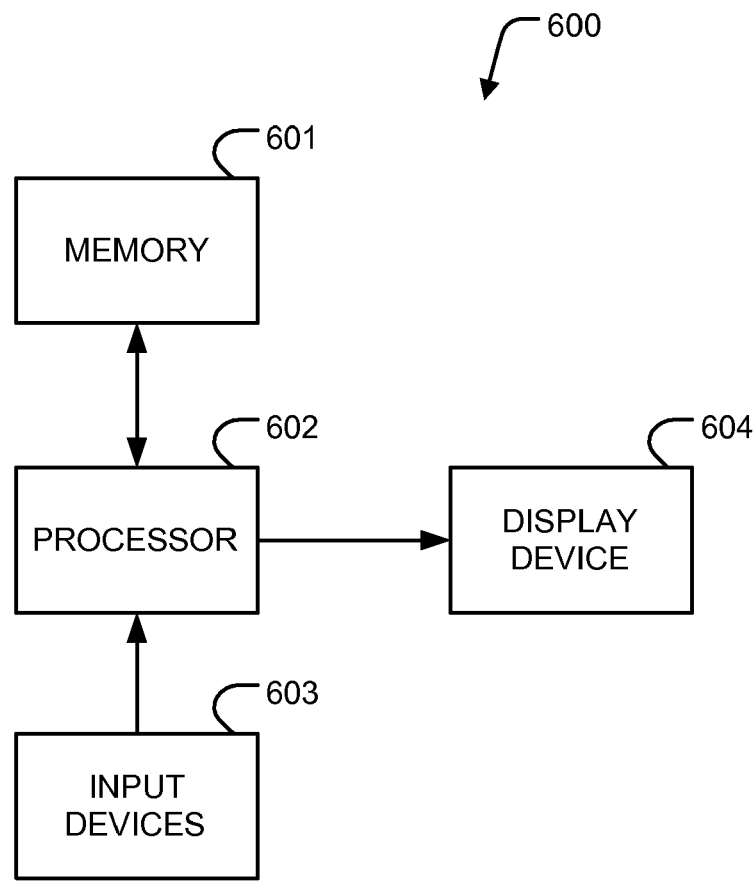
FIG. 6 illustrates a computer apparatus, according to an example embodiment.

Additionally, as noted above, the methodologies described hereinbefore may be implemented by a computer system or apparatus. For example, FIG. 6 illustrates a computer apparatus, according to an example embodiment. Therefore, portions or the entirety of the methodologies described herein may be executed as instructions in a processor 602 of the computer system 600. The computer system 600 includes memory 601 for storage of instructions and information, input device(s) 603 for computer communication, and display device 604. Thus, the present invention may be implemented, in software, for example, as any suitable computer program on a computer system somewhat similar to computer system 600. For example, a program in accordance with the present invention may be a computer program product causing a computer to execute the example methods described herein.

The computer program product may include a computer-readable medium having computer program logic or code portions embodied thereon for enabling a processor (e.g., 602) of a computer apparatus (e.g., 600) to perform one or more functions in accordance with one or more of the example methodologies described above. The computer program logic may thus cause the processor to perform one or more of the example methodologies, or one or more functions of a given methodology described herein.

The computer-readable storage medium may be a built-in medium installed inside a computer main body or removable medium arranged so that it can be separated from the computer main body. Examples of the built-in medium include, but are not limited to, rewriteable non-volatile memories, such as RAMs, ROMs, flash memories, and hard disks. Examples of a removable medium may include, but are not limited to, optical storage media such as CD-ROMs and DVDs; magneto-optical storage media such as MOs; magnetism storage media such as floppy disks (trademark), cassette tapes, and removable hard disks; media with a built-in rewriteable non-volatile memory such as memory cards; and media with a built-in ROM, such as ROM cassettes.

Further, such programs, when recorded on computer-readable storage media, may be readily stored and distributed. The storage medium, as it is read by a computer, may enable the method(s) disclosed herein, in accordance with an exemplary embodiment of the present invention.

With an exemplary embodiment of the present invention having thus been described, it will be obvious that the same may be varied in many ways. The description of the invention hereinbefore uses this example, including the best mode, to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims. Such variations are not to be regarded as a departure from the spirit and scope of the present invention, and all such modifications are intended to be included within the scope of the present invention as stated in the following claims.

What is claimed is:

1. A method of locating a short circuit of a shorted circuit path in a circuit layout, the method comprising:

receiving a connecting stack of the circuit layout, the connecting stack including interconnecting paths representing conductive traces of a circuit design;

receiving the circuit layout defining the connecting stack;

receiving at least four virtual probe locations, the at least four virtual probe locations existing on the connecting stack on at least two different nodes along the shorted circuit path;

identifying shortest paths between the at least four virtual probe locations, the shortest paths being identified between pairs of the at least four probe locations and being between the at least two different nodes; and outputting an intersection of the shortest paths, the intersection including a location of the short circuit.

* * * * *